United States Patent
Jordan et al.

(10) Patent No.: US 6,504,442 B2
(45) Date of Patent: Jan. 7, 2003

(54) DIGITALLY CONTROLLED OSCILLATOR WITH RECOVERY FROM SLEEP MODE

(75) Inventors: Richard Jordan, Hinesburg, VT (US); Anthony J. Perri, Jericho, VT (US)

(73) Assignee: International Busisness Machines Corporation, Armonk, NY (US)

( * ) Notice: Subject to any disclaimer, the term of this patent is extended or adjusted under 35 U.S.C. 154(b) by 0 days.

(21) Appl. No.: 09/826,598

(22) Filed: Apr. 5, 2001

(65) Prior Publication Data

US 2002/0145474 A1 Oct. 10, 2002

(51) Int. Cl.$^7$ ................................................. H03L 7/08
(52) U.S. Cl. ......................................... 331/173; 331/25
(58) Field of Search ........................... 331/1 A, 14, 16, 331/17, 18, 25, 172, 173; 327/156–159; 360/51; 375/376; 455/260

(56) References Cited

U.S. PATENT DOCUMENTS 5,355,098 A * 10/1994 Iwasaki ....................... 331/14

* cited by examiner

Primary Examiner—David C. Mis
(74) Attorney, Agent, or Firm—Frederick W. Gibb, III; Richard A. Henkler, Esq.

(57) ABSTRACT

A digitally controlled oscillator includes an adjustable signal generating circuit adapted to generate an oscillation signal. A feedback loop receives the oscillation signal from the adjustable signal generating circuit. The feedback loop detects error in the oscillation signal and produces an error signal based on the error. The control logic circuit receives the error signal from the feedback loop and maintains the oscillation signal within a predetermined error range. Also, a state device that is connected to the adjustable signal generating circuit maintains a previous operating state of the adjustable signal generating circuit when the digitally controlled oscillator is temporarily powered down. When the digitally controlled oscillator is powered up after being temporarily powered down, the control logic starts the adjustable signal generating circuit at the previous operating state based upon data maintained within the state device, and restarts the feedback loop and error processing circuits in a way to avoid oscillator adjustments based on old data.

16 Claims, 2 Drawing Sheets

DIGITALLY CONTROLLED OSCILLATOR WITH RECOVERY FROM SLEEP MODE

BACKGROUND OF THE INVENTION

1. Field of the Invention

The present invention generally relates to oscillations circuits and more particularly to a digitally controlled oscillator that provides an immediate recovery from a low-power sleep mode, without any delay.

2. Description of the Related Art

Oscillators are used in many current electronic devices such as portable communication devices (cell phones) and computers. In addition, integrated circuit chips with different modes need to be able to power down the non-active areas to keep operating power low. It is desirable to reduce the power consumed by these devices so as to make the power supply sources smaller and longer lasting.

One source of power consumption within such devices is the oscillators. Therefore, it is desirable to reduce or eliminate the power consumed by the oscillators, when the oscillating signal is not required. However, conventional oscillators generally require a start-up period to produce a stable signal. Therefore, it is common in conventional circuits to allow the oscillators to continue to run in order to avoid the time penalty associated with the start up period.

The start-up time of an oscillator is defined as the time required for the oscillator to reach a steady state. Presently, for most oscillators, the start-up time can be a few milliseconds to several seconds depending on the crystal frequency and amplifier design of the oscillator. The start-up time may be even longer when the temperature of the device using the oscillator increases. The reason for the delay is that when the conventional oscillator circuit is powered up, the output of the amplifying inverter begins to bias the input through a bias resistor. The bias resistor and the load capacitors are large and the amplifying inverter may be weak. This causes considerable delay for the oscillator circuit to reach appropriate bias levels. After start-up, the oscillator circuit losses cause the oscillator circuit to stabilize (i.e., loop gain is approximately one).

One example of a conventional oscillator is found in U.S. Pat. No. 5,834,982, incorporated herein by reference. Such a conventional oscillator, shown in FIG. 1, is a Colpitts-type crystal oscillator. The Colpitts-type crystal oscillator is a Barkhausen-type oscillator having capacitive reactances between the collector and the emitter and between the base and the emitter, respectively, and an inductive reactance between the collector and the base. The Colpitts-type crystal oscillator uses a crystal resonator as the inductive reactance device.

Referring to FIG. 1, the conventional Colpitts-type oscillator includes an oscillating transistor $Q_1$, a capacitor $C_1$, a capacitor $C_2$, a capacitor $C_3$, a crystal resonator $X_1$, and four resistors $R_1$–$R_4$. The capacitor $C_1$ functions as the capacitive reactance between the collector and the emitter. The capacitor $C_2$ functions as the capacitive reactance between the base and the emitter. The series of the crystal resonator $X_1$ and the capacitor $C_3$ has a positive reactance and functions as the inductive reactance between the collector and the base. The two resistors $R_1$ and $R_2$ divide the power source voltage $V_{CC}$. A connection point of the two resistors $R_1$ and $R_2$ is connected to the base of the oscillating transistor $Q_1$. As a result, a base current $I_{B1}$ is determined by resistance values of the two resistors $R_1$ and $R_2$ and flows into the base of the oscillating transistor $Q_1$. The collector of the oscillating transistor $Q_1$ is supplied with a collector current $I_{C1}$, determined by a resistance value of the resistor $R_4$.

This kind of oscillator requires a long a starting time until the oscillator reaches a steady state after the power source is supplied. In the conventional Colpitts-type crystal oscillator, the power source voltage $V_{CC}$, a grounded-emitter current amplification factor $\beta$ of the oscillating transistor $Q_1$, and the collector current $I_{C1}$ are given by $V_{CC}$=3V, $\beta$.=180, $i_{C1}$=0.3 mA, respectively. FIG. 2 illustrates the above-mentioned conditions.

In FIG. 2, the starting time TS is defined as a time period required for an output (AC voltage) level $V_{OSC}$ of the oscillating circuit $Q_1$ to reach 90% of an output level $V_{const}$ of the oscillator at the steady state after the power source is supplied to the oscillator. As understood from FIG. 2, it is apparent that the starting time TS of this conventional oscillator is about 5.5 msec. Conventionally, the collector current $I_{C1}$ of the oscillating transistor $Q_1$. is increased in order to reduce the starting time TS. However, if the collector current $I_{C1}$ of the oscillating transistor $Q_1$, is large (to improve the starting characteristic of the oscillator) the power consumption of the oscillator is undesirably increased.

Therefore, there is a need for a new type of oscillator circuit that does not incur the power or time penalties that are seen in conventional oscillator devices. The invention described below allows the oscillator to be shut off to reduce or eliminate power consumption, yet allows the oscillator to immediately turn on when required, without delay, and without excessive power consumption.

SUMMARY OF THE INVENTION

In view of the foregoing and other problems, disadvantages, and drawbacks of conventional oscillator circuits, the present invention has been devised, and it is an object of the present invention to provide an improved oscillation circuit.

In order to attain the object(s) suggested above, there is provided, according to one aspect of the invention a digitally controlled oscillator that includes a state circuit for maintaining the state of the oscillator prior to shutting the oscillator off and method for restoring the oscillator to the saved state when the oscillator is turned on.

The digitally controlled oscillator also includes an adjustable frequency loop for producing an oscillation signal. The state circuit maintains a state of the adjustable frequency loop prior to shutting the oscillator off. The "state" of the adjustable frequency loop is the frequency of the oscillation signal. The invention may also include integration and control logic adapted to control the state circuit to save the state of the oscillator upon receipt of a hold signal. Otherwise, the integration and control logic maintains a frequency of the oscillation signal output by the oscillator when the hold signal is absent. The digitally controlled oscillator also preferably includes an error loop that maintains a frequency of the oscillation signal output by the oscillator within a predetermined range. Upon receipt of an enable signal, the restore circuit causes the oscillator to immediately output an oscillation signal based on the saved state.

In another embodiment, the invention comprises a digitally controlled oscillator that includes an adjustable signal generating circuit adapted to generate an oscillation signal. A feedback loop receives the oscillation signal from the adjustable signal generating circuit. The feedback loop detects error in the oscillation signal and produces an error signal based on the error. The control logic circuit receives the error signal from the feedback loop and maintains the oscillation signal within a predetermined error range. Also, a state device that is connected to the adjustable signal generating circuit maintains a previous operating state of the adjustable signal generating circuit when the digitally controlled oscillator is temporarily powered down.

When the digitally controlled oscillator is powered up after being temporarily powered down, the control logic starts the adjustable signal generating circuit at the previous operating state based upon data maintained within the state device. The "previous operating state" includes the previous frequency of the oscillation signal. Upon being powered up, the digitally controlled oscillator immediately outputs the oscillation signal based upon the previous operating state maintained within the state device, without initially processing the oscillation signal through the feedback loop. However, after the digitally controlled oscillator is powered up and is back in normal operation, the oscillation signal is processed through the feedback loop to maintain the frequency of the oscillation signal within the predetermined frequency range.

An important feature of the invention is that the adjustable signal generating circuit and the feedback loop do not consume power when the oscillator is temporarily powered down.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

As discussed above, conventional oscillators generally need to be powered up at all times since the acquisition time from low power is too long. The invention presents a digitally controlled oscillator which can be shut off, where the state of the oscillator is saved. Since the state (e.g., frequency, process effects, temperature effects, etc.) is saved, the digitally controlled oscillator can be immediately restarted at its previous state, without any delay associated with the oscillator checking and adjusting the frequency, phase, etc.

The invention stops the clocks and shuts off the ring oscillator when the oscillator is not needed. The state of the oscillator is saved, so that on a restart, the ring oscillator will start at the same frequency. Therefore, the invention produces the ability to synchronously start and stop clocks, the ability to store, shut down and then instantly re-apply the operating state. The circuit consumes zero power when shut off, thus producing substantial power savings.

Figure 1:
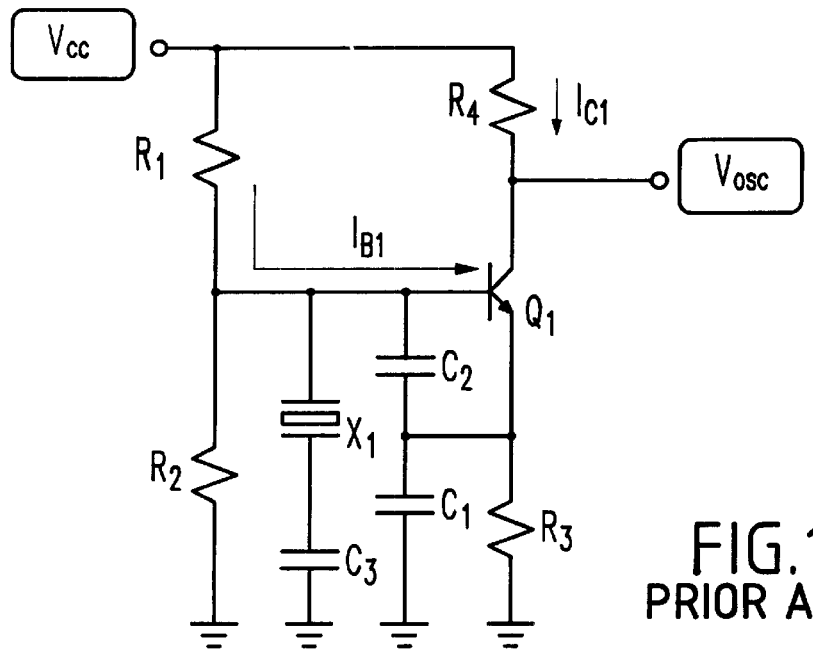
FIG. 1 is a schematic diagram of a conventional oscillation circuit.
Figure 2:
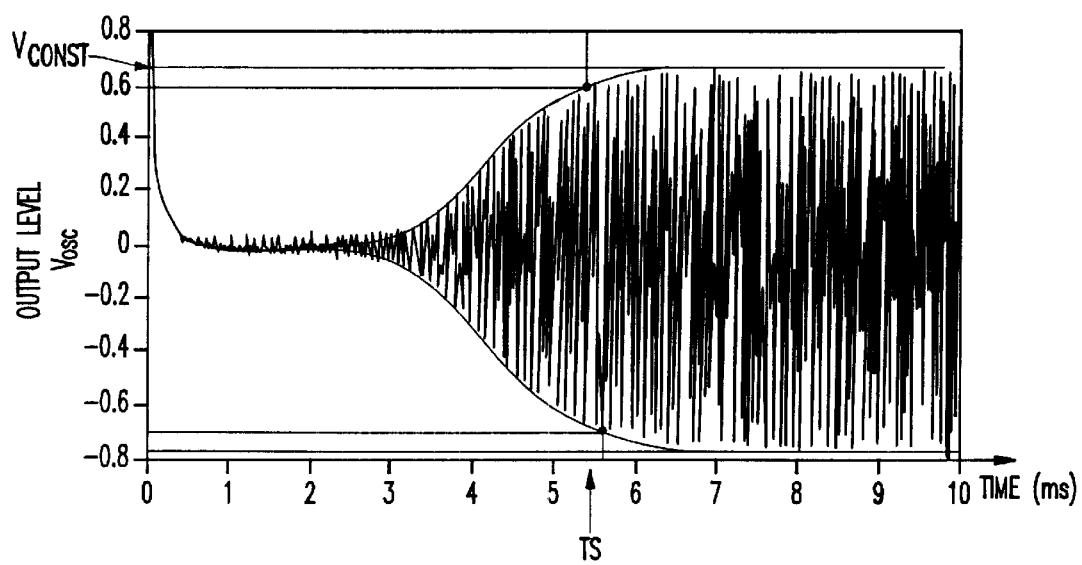
FIG. 2 is illustrating the performance of the circuit shown in FIG. 1.
Figure 3:
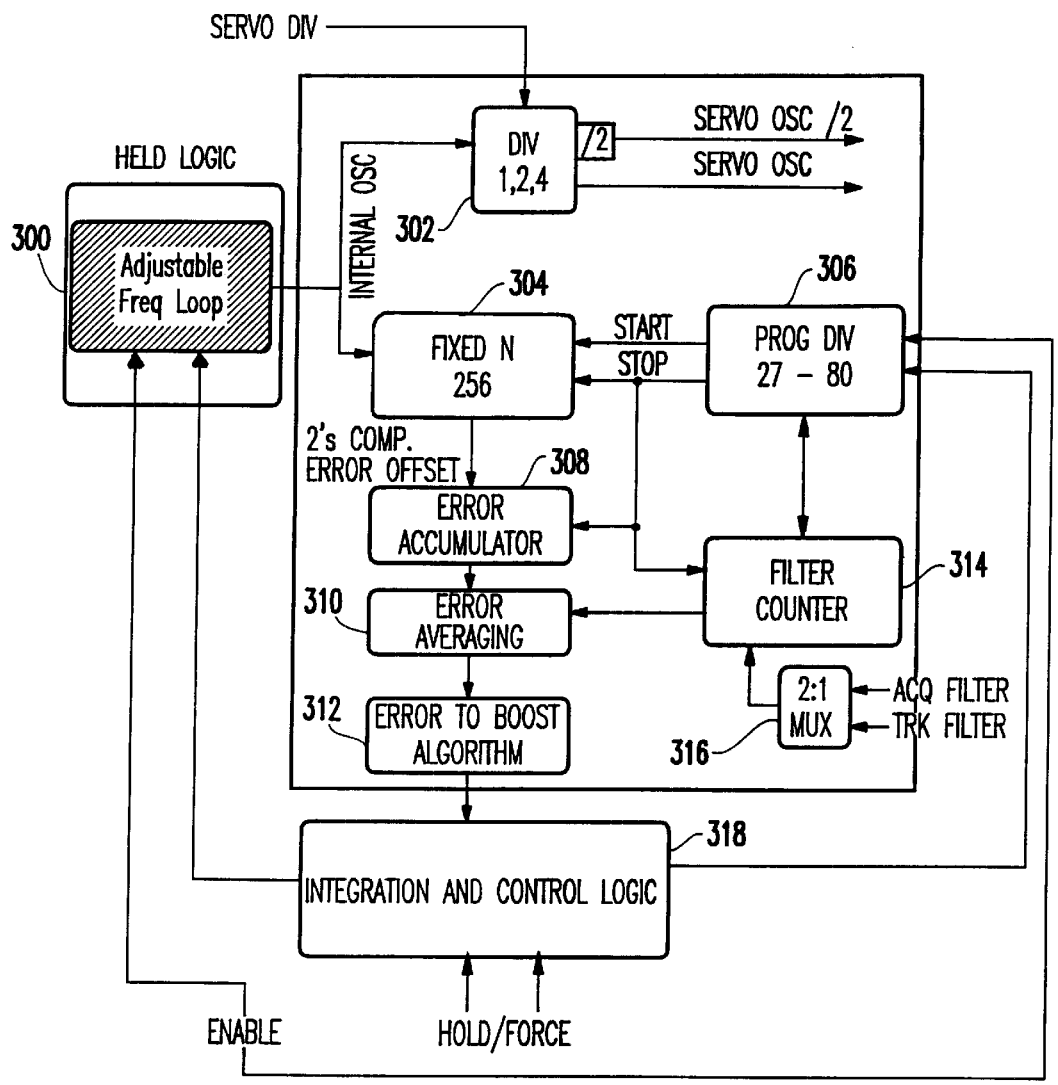
FIG. 3 is a schematic diagram of the inventive oscillation circuit.

FIG. 3 illustrates one embodiment of the invention. The oscillator circuit shown in FIG. 3 includes an adjustable frequency loop 300 that includes inverter which produce an internal oscillation signal (internal osc). The internal oscillation signal output by the frequency loop 300 is supplied to the divisor 302. The divisor 302 is controlled by the servo divisor (SERVO Div) signal which determines whether the servo oscillations/2 or primary servo oscillation signal will be output from the divisor 302 as the ultimate oscillation signal output from the circuit.

The adjustable frequency loop 300 also supplies the internal oscillations signal to a counter 304 which, in this example, is a fixed counter where N is set at 256. Counter 304 accepts asynchronous start and stop signals. The start signal initializes the counter to 256, and the counter decrements by 1 or each clock cycle (internal osc) until receiving the stop signal. The counter will count past 0 which effectively creates a 2's complement error representation of the difference between the N count (at internal osc frequency) and the program divisor 306 (at a reference frequency).

The counter 304 is controlled by a program divisor 306 which starts and stops the counter to control the frequency of the signal being output by the adjustable frequency loop 300. The program divisor 306 receives input from the filter counter 314. The magnitude of the adjustments that are required by the filter counter 314 depend upon whether the oscillator is in the acquisition mode (ACQ filter) or in the tracking mode (TRK filter). More specifically, the multiplexor 316 supplies either the acquisition filter signal or the tracking filter signal to control the magnitude of the filter counter 314. The filter counter 314 controls the number of cycles the program divisor 306 will wrap between the start signal and the stop signal going to counter 304. This allows multi-cycle accumulation of the error.

The counter 304 outputs a 2's complement error offset to the error accumulator 308, which is also under the control of the stock signal produced by the program divisor 306. The error accumulator 308 sums the error output from counter 304 following the completion of each cycle of the program divisor 306. The setting of the filter counter 314, determines the number of times the error output is accumulated. Since the error can be both positive and negative, the accumulator 308 must be capable of addition as well as subtraction. The accumulator 308 must be large enough to be able to hold a value which is the maximum allowed error output of counter 304 multiplied by the maximum allowable counts of the filter counter 314. When the system is locked onto the target frequency, the accumulator should be adding and subtracting very small values thereby staying at or near zero.

The signal is then processed through the error averaging unit 310, which acts at the direction of the filter counter 314 to divide the error offset by a specific amount depending upon the output of the filter counter 314. After the filter counter 314 has completed it's count, the error averaging unit 310 divides the accumulated error stored in 308 by the number of times filter counter 314 counted. The end result is the average error for each loop of the program divisor 306. The division is accomplished via a shift circuit which is simplified due to limiting the filter counter 314 to only binary counts (1, 2, 4, 8, etc.). The digital values for the ACQ/TRK filters provided by multiplexor 316 are defined such that they can be directly loaded into filter counter 314, as well as control the mux 316 selections of the error averaging unit 310, which provides an elegant method of division.

Using the information from the error averaging unit 310, the error to boost algorithm engine 312 outputs the amount by which the frequency should be changed to maintain the oscillation signal within the desired range. The error to boost engine 312 converts the magnitude of the error into a value that falls into the functional range of the integration and control logic unit 318. This circuit decouples the N and D counters from the frequency correction circuits. Therefore, changes can be made to either portion of the system without forcing the entire system to be modified. For example, the error output may be divided by four to provide the amount by which the frequency will be adjusted. In a case as described above, errors less than four would produce no change in frequency. The size of this "no change" area is a function of the largest single-step delay that can be seen for all process, voltage, and temperature combinations. In other words, the largest possible single-step delay defines the smallest achievable frequency adjustment.

This control information from the algorithm engine 312 is processed through the integration and control logic unit 318 back to the adjustable frequency loop 300 to modify the frequency of the oscillation signal output by the adjustable frequency loop 300 accordingly.

In addition, the invention includes hold and force inputs into the integration and control logic unit 318. The hold and force inputs are external inputs to the oscillation circuit which indicate that the oscillation signal is temporarily not needed and that the oscillation circuit can power down. More specifically, the "hold" signal indicates that the oscillator can power down and the "force" signal is used to debug the oscillators circuit. The force signals can be used to independantly override the integration and control unit 318. These enable direct control of the adjustable frequency loop 300.

When the integration and control logic indicates that the oscillator can power down, the adjustable frequency loop 300 is placed in a static hold state. In addition, the integration and control logic 318 maintains the state of the adjustable frequency loop and shuts down the program divisor 306 upon receiving the hold signal. Otherwise, the program divisor 306 would continue to operate. When the adjustable frequency loop 300 is in the hold state, and does not output the oscillation signal, the devices within the oscillations circuit (302, 304, 308, 310, 312, 314, 316) do not operate and do not consume any power. The program divisor 306 needs to be specifically shut down since it is generally clocked by an external reference.

Upon receiving the enable signal, the adjustable frequency loop is immediately established at its previous state held by the integration and control logic 318 and the oscillator immediately outputs the previous oscillations signal without any delay. As shown in FIG. 3, the enable signal is also supplied to the program divisor 306 to reactivate its operation. Thus, the invention includes a state circuit 318 for maintaining the saved state of the oscillator prior to shutting the oscillator off and a restore circuit (e.g., the enable signal) for restoring the oscillator to the saved state when the oscillator is turned on. The integration and control logic 318 maintains the state of the adjustable frequency loop prior to shutting the oscillator off. Otherwise, the integration and control logic 318 maintains the frequency of the oscillation signal output by the oscillator 300 when the hold signal is absent. The error loop (304, 308, 310, 312, 318, etc.) maintains the frequency of the oscillation signal output by the oscillator within a predetermined range.

Figure 4:
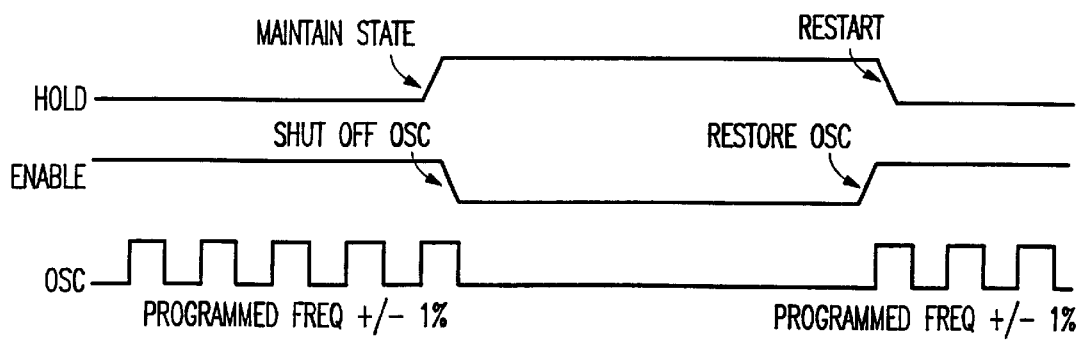
FIG. 4 is a timing signal diagram showing the state of the signals being processed in the circuit shown in FIG. 3.

The timing of the signals processed in the circuit shown in FIG. 3 are shown in FIG. 4. More specifically, as shown in FIG. 4, when the hold signal goes high, the enabled signal goes low, shutting off the internal osc signal. As soon as the hold signal goes low, the enable signal goes high and the internal osc signal begins immediately (without any delay) as shown in FIG. 4.

In a preferred embodiment, the invention includes a frequency loop which accepts static delay control. The integration and control logic unit 318 stores the loop control information in static latches which will retain their state using zero power when clocks are de-activated.

Thus, as shown above, the invention includes an adjustable signal generating circuit 300 that generates an oscillation signal (internal osc). The feedback loop (304, 308, 310, 312, 318, etc.) receives the oscillation signal and detects error in the oscillation signal to produce an error signal. The control logic circuit 318 receives the error signal from the feedback loop and maintains the oscillation signal within a predetermined error range. Also, the control logic 318 is connected to the adjustable signal generating circuit 300 to maintain a previous operating state of the adjustable signal generating circuit when the digitally controlled oscillator is temporarily powered down.

When the digitally controlled oscillator is powered up after being temporarily powered down, the control logic 318 starts the adjustable signal generating circuit at the previous operating state based upon data maintained within the control logic 318. The "previous operating state" includes the previous frequency, previous process effects, previous temperature effects, etc. of the oscillation signal. Upon being powered up, the digitally controlled oscillator immediately outputs the oscillation signal based upon the previous operating state maintained within the state device, without initially processing the oscillation signal through the feedback loop. However, after the digitally controlled oscillator is powered up and is back in normal operation, the oscillation signal is processed through the feedback loop and the feedback loop maintains the frequency of the oscillation signal within a predetermined frequency range.

An important feature of the invention is that the adjustable signal generating circuit and the feedback loop do not consume power when the oscillator is temporarily powered down. The invention presents a digitally controlled oscillator which can be shut off, where the state of the oscillator is saved. Since the previous state is saved, the digitally controlled oscillator can be immediately restarted at its previous state, without any delay associated with the oscillator checking and adjusting the frequency, phase, etc. The invention stops the clocks and shuts off the ring oscillator when the oscillator is not needed. Therefore, the invention produces the ability to synchronously start and stop clocks, the ability to store, shut down and then instantly re-apply the operating state. The circuit consumes zero power when disabled, thus producing substantial power savings.

While the invention has been described in terms of preferred embodiments, those skilled in the art will recognize that the invention can be practiced with modification within the spirit and scope of the appended claims.

What is claimed is:

1. A digitally controlled oscillator comprising:
   a state circuit for maintaining the state of said oscillator prior to shutting said oscillator off; and
   a restart circuit adapted to restore said state of said oscillator when said oscillator is turned back on,
   wherein said state of said oscillator comprises a previous frequency, previous process effects, and previous temperature effects.

2. The digitally controlled oscillator in claim 1, further comprising an adjustable frequency loop for producing an oscillation signal, wherein said state circuit maintains a state of said adjustable frequency loop prior to shutting said oscillator off.

3. The digitally controlled oscillator in claim 2, wherein said state of said adjustable frequency loop includes a frequency of said oscillation signal.

4. The digitally controlled oscillator in claim 1, further comprising integration and control logic adapted to control said state circuit to save said state of said oscillator upon receipt of a hold signal.

5. The digitally controlled oscillator in claim 4, wherein said integration and control logic maintains a frequency of an oscillation signal output by said oscillator when said hold signal is absent.

6. The digitally controlled oscillator in claim 1, further comprising an error loop adapted to maintain a frequency of an oscillation signal output by said oscillator within a predetermined range.

7. The digitally controlled oscillator in claim 1, wherein upon receipt of an enable signal, said restart circuit causes said oscillator to immediately output an oscillation signal based on said state of said oscillator.

8. A digitally controlled oscillator comprising:

an adjustable signal generating circuit adapted to generate an oscillation signal;

a feedback loop receiving said oscillation signal from said adjustable signal generating circuit, said feedback loop being adapted to detect error in said oscillation signal and produce an error signal based on said error;

a control logic circuit receiving said error signal from said feedback loop and being adapted to maintain said oscillation signal within a predetermined error range; and a state device connected to said adjustable signal generating circuit, wherein said state device maintains a previous operating state of said adjustable signal generating circuit when said digitally controlled oscillator is temporarily powered down, wherein said previous operating state comprises a previous frequency, previous process effects, and previous temperature effects.

9. The digitally controlled oscillator in claim 8, wherein when said digitally controlled oscillator is powered up after being temporarily powered down, said control logic starts said adjustable signal generating circuit at said previous operating state based upon data maintained within said state device.

10. The digitally controlled oscillator in claim 9, wherein, upon being powered up, said digitally controlled oscillator immediately outputs said oscillation signal based upon said previous operating state maintained within said state device, without initially processing said oscillation signal through said feedback loop.

11. The digitally controlled oscillator in claim 10, wherein, after being powered up, said oscillation signal is processed through said feedback loop.

12. The digitally controlled oscillator in claim 8, wherein said adjustable signal generating circuit and said feedback loop do not consume power when said oscillator is temporarily powered down.

13. A digitally controlled oscillator comprising:

an adjustable signal generating circuit adapted to generate an oscillation signal;

a feedback loop receiving said oscillation signal from said adjustable signal generating circuit, said feedback loop being adapted to detect error in said oscillation signal and produce an error signal based on said error;

a control logic circuit receiving said error signal from said feedback loop and being adapted to maintain said oscillation signal within a predetermined error range; and a state device connected to said adjustable signal generating circuit, wherein said state device maintains a previous operating state of said adjustable signal generating circuit when said digitally controlled oscillator is temporarily powered down, and wherein said adjustable signal generating circuit and said feedback loop do not consume power when said oscillator is temporarily powered down, wherein said previous operating state comprises a previous frequency, previous process effects, and previous temperature effects.

14. The digitally controlled oscillator in claim 13, wherein when said digitally controlled oscillator is powered up after being temporarily powered down, said control logic starts said adjustable signal generating circuit at said previous operating state based upon data maintained within said state device.

15. The digitally controlled oscillator in claim 14, wherein, upon being powered up, said digitally controlled oscillator immediately outputs said oscillation signal based upon said previous operating state maintained within said state device, without initially processing said oscillation signal through said feedback loop.

16. The digitally controlled oscillator in claim 15, wherein, after being powered up, said oscillation signal is processed through said feedback loop.

* * * * *